(12) United States Patent
Bouche et al.

(10) Patent No.: US 7,550,900 B2
(45) Date of Patent: Jun. 23, 2009

(54) ACOUSTIC RESONATOR DEVICE

(75) Inventors: Guillaume Bouche, Grenoble (FR); Gregory Caruyer, Goncelin (FR); Pascal Ancey, Revel (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 11/009,688

(22) Filed: Dec. 10, 2004

(65) Prior Publication Data

US 2005/0168104 A1 Aug. 4, 2005

(30) Foreign Application Priority Data

Dec. 12, 2003 (FR) ................................. 03 14567

(51) Int. Cl.
*H01L 41/08* (2006.01)
(52) U.S. Cl. ...................... 310/327; 310/324
(58) Field of Classification Search ................ 310/334, 310/322, 324, 327, 335; 333/189
See application file for complete search history.

(56) References Cited

U.S. PATENT DOCUMENTS

| | | | | |
|---|---|---|---|---|
| 5,629,906 | A * | 5/1997 | Sudol et al. | 310/335 |
| 5,821,833 | A * | 10/1998 | Lakin | 333/187 |
| 5,864,261 | A | 1/1999 | Weber | |
| 5,872,493 | A * | 2/1999 | Ella | 333/191 |
| 5,873,154 | A * | 2/1999 | Ylilammi et al. | 310/334 |
| 6,087,198 | A | 7/2000 | Panasik | |
| 6,372,661 | B1 * | 4/2002 | Lin et al. | 438/769 |
| 6,437,484 | B1 * | 8/2002 | Nishimura et al. | 310/324 |
| 6,630,740 | B1 * | 10/2003 | Orita et al. | 257/762 |
| 6,664,641 | B2 * | 12/2003 | Ohsaki et al. | 257/774 |
| 6,972,641 | B2 * | 12/2005 | Huynh | 333/189 |
| 7,053,730 | B2 * | 5/2006 | Park et al. | 310/322 |
| 7,391,142 | B2 * | 6/2008 | Bouche et al. | 310/327 |
| 7,391,143 | B2 * | 6/2008 | Bouche et al. | 310/327 |
| 2002/0093398 | A1 | 7/2002 | Ella et al. | |
| 2004/0140869 | A1 * | 7/2004 | Marksteiner et al. | 333/189 |
| 2004/0150293 | A1 * | 8/2004 | Unterberger | 310/322 |

FOREIGN PATENT DOCUMENTS

DE 3710339 A1 * 10/1988
EP 1315294 A2 * 5/2003

(Continued)

OTHER PUBLICATIONS

K.M.Lakin, "Bulk Acoustic Wave Coupled Resonator Filters",2002 IEEE International Frequency Control Symposium and PDA Exhibiton, pp. 8-14.*
K.M. Lakin, "Bulk Acoustic Wave Coupled Resonator Filters", 2002 IEEE International Frequency Control Symposium and PDA Exhibition, pp. 8-14.

(Continued)

*Primary Examiner*—Jaydi SanMartin
(74) *Attorney, Agent, or Firm*—Lisa K. Jorgenson; Jose Gutman; Fleit Gibbons Gutman Bongini & Bianco P.L.

(57) ABSTRACT

Acoustic resonator device (1) includes an active element (6) and a support provided with a membrane (5). The active element (6) is provided with at least one piezoelectric layer (10) and is surmounted by a multilayer stack (12). The multilayer stack (12) is provided with at least three layers, including at least one layer (15) of high acoustic impedance and at least one layer (13) of low acoustic impedance. An integrated circuit including at least one such acoustic resonator device is also disclosed.

20 Claims, 3 Drawing Sheets

FOREIGN PATENT DOCUMENTS

| | | | | |
|---|---|---|---|---|
| JP | 58106457 | A | * | 6/1983 |
| JP | 58131558 | A | * | 8/1983 |
| JP | 60260848 | A | * | 12/1985 |

OTHER PUBLICATIONS

French Preliminary Search Report dated Jul. 15, 2004 for French Application No. 0314567.

* cited by examiner

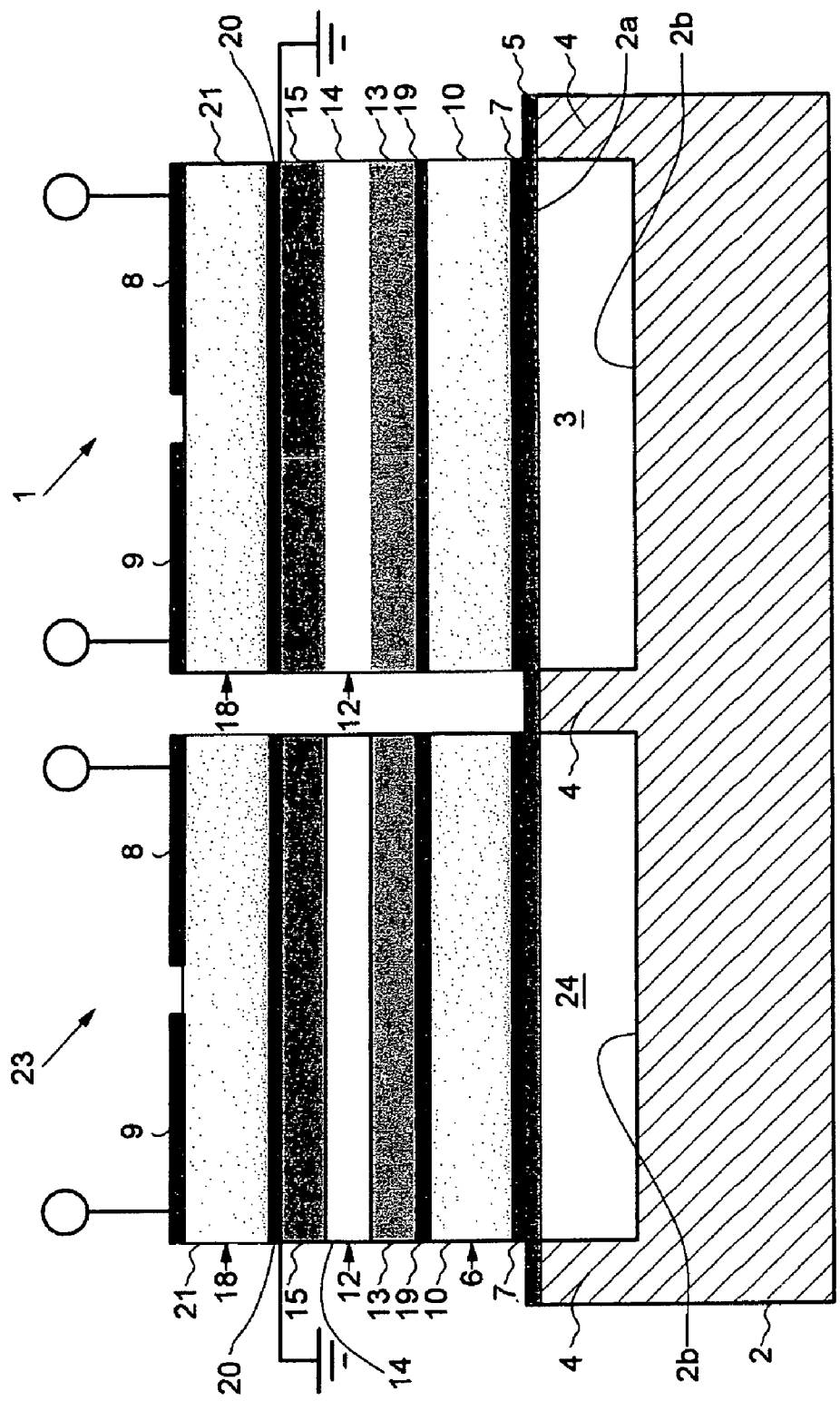

ACOUSTIC RESONATOR DEVICE

CROSS-REFERENCE TO RELATED APPLICATION

This application is based upon and claims priority from prior French Patent Application No. 03 14567, filed on Dec. 12, 2003, the entire disclosure of which is herein incorporated by reference.

BACKGROUND OF THE INVENTION

1. Field of the Invention

The invention relates to the field of circuits and microsystems comprising one or more piezoelectric resonators. More particularly, the invention relates to the production of such a resonator in integrated form, being produced using a technology generally employed for the production of integrated circuits.

2. Description of the Related Art

Resonators in integrated circuits can be used as filters in mobile telephony applications. A noisy signal is applied to the upper electrode. A filtered signal centered on the resonant frequency of the resonator is recovered on the lower electrode. This frequency is directly determined by the thickness of a piezoelectric film placed between the two electrodes. An assembly of resonators allows a filter function to be constituted. The resonator is used as a filter element of high quality factor.

The resonators are integral with the integrated circuit, all of them having to be acoustically isolated relative to the latter. For this purpose, a support capable of producing such isolation may be provided. The support may comprise an alternation of layers of high acoustic impedance and layers of low acoustic impedance. The support may include a suspended membrane.

The actual resonator comprises an active element, formed from a piezoelectric material, placed between two electrodes. The resonant frequency of the resonator depends essentially on the thickness of the piezoelectric material, on its mechanical properties and on the mechanical properties of the electrodes. Resonators may be connected together in various configurations in order to produce filters. The central frequency of such assemblies depends on the resonant frequency of each of the resonators of which it is composed.

Document U.S. Pat. No. 5,821,833 proposes a device consisting of a stacked-crystal filter, a support substrate and an acoustic reflector placed between the substrate and the filter in order to eliminate undesirable resonant frequencies, namely the principal mode and the third harmonic.

The article "*Bulk acoustic wave coupled resonator filters*" by K. M. Lakin on pages 8 to 14 of 2002 IEEE International Frequency Control Symposium and PDA Exhibition has reviewed stacked-crystal filters and coupled-resonator filters, in which two resonators are coupled by coupling layers placed between them. The filters of both types are mounted on bulk isolation reflectors supported by a bulk substrate.

Accordingly, there exists a need for overcoming the disadvantages of the prior art as discussed above.

SUMMARY OF THE INVENTION

It is an object of the invention to remedy the drawbacks of such devices.

The object of the invention is to improve the isolation between the filter and the other parts of a circuit in order to prevent the transmission of undesirable vibrations.

According to one aspect of the invention, the acoustic resonator device comprises an active element and a support provided with a membrane, and the active element is provided with at least one piezoelectric layer and is surmounted by a multilayer stack provided with at least three layers, including at least one layer of high acoustic impedance and at least one layer of low acoustic impedance.

The term "membrane" is understood to mean a layer of material having at least one face that is at least partly in contact with a fluid, especially a gas such as air or argon, placed in a neighboring region. A membrane may move relative to the neighboring region without appreciable influence on other elements, such as elements defining the region.

Preferably, the multilayer stack comprises two layers of low acoustic impedance surrounding a layer of high acoustic impedance. The term "acoustic impedance" is understood to mean the quantity Z formed by the product of the density $\rho$ of the material and the acoustic velocity $v$, i.e. $Z=\rho \times v$. The acoustic velocity $v$ may be defined as follows:

$$v = \left(\frac{C_{33}}{\rho}\right)^{1/2}$$

where $C_{33}$ is one of the coefficients of the elastic compliance matrix.

For high acoustic isolation performance, it is desirable for the difference in acoustic impedance between the materials to be as large as possible.

In one embodiment of the invention, the active element is in contact with a layer of low acoustic impedance of the multilayer stack.

In one embodiment of the invention, the membrane is formed by a lower electrode of the active element. In other words, such an element fulfils both the electrical function of an electrode and the mechanical function of a membrane. There is thus a saving of one layer.

In another embodiment of the invention, the membrane is placed beneath a lower electrode of the active element. The membrane is preferably placed in contact with the lower electrode of the active element.

In one embodiment of the invention, the active element comprises a piezoelectric layer, a lower electrode layer and an upper electrode layer, the piezoelectric layer being placed between the lower electrode layer and the upper electrode layer. The multilayer stack may be placed on the upper electrode layer.

In one embodiment of the invention, the active element comprises two piezoelectric layers and three electrode layers, one piezoelectric layer being placed between two electrode layers. The multilayer stack may be placed on the upper electrode layer.

In one embodiment of the invention, the active element comprises two piezoelectric layers, four electrode layers and a multilayer stack provided with at least three layers, including at least one layer of high acoustic impedance and at least one layer of low acoustic impedance, one piezoelectric layer being placed between two electrode layers, and the multilayer stack being placed between an electrode layer adjacent to a lower piezoelectric layer and an electrode layer adjacent to an upper piezoelectric layer.

Advantageously, the membrane is an acoustic isolation membrane.

In one embodiment of the invention, an empty space is left beneath the membrane.

In one embodiment of the invention, the electrode layers are based on the following materials: Ag, Al, Au, Cu, La, Mo, Ni, Pt, Ta, Ti, W. The electrodes may have a thickness of less than 1 µm, and preferably less than 0.3 µm.

In one embodiment of the invention, the membrane is based on silicon nitride or a metal nitride.

In one embodiment of the invention, the piezoelectric layers are based on the following materials: AlN, $BaTiO_3$, $KNbO_3$, $LaLiTaO_3$, $LiNbO_3$, $PbTiO_3$, $PbZrTiO_3$, ZnO, ZnS. The piezoelectric layers may have a thickness of between 0.5 and 5 µm, preferably between 1 and 3 µm.

In one embodiment of the invention, the layers of the multilayer stack are based on the following materials: AlN, $SiO_2$, W, organic silicides, especially SiOC, Mo.

Advantageously, a membrane is common with a plurality of resonators. A membrane may support at least one resonator and at least one micromechanical member.

In one embodiment of the invention, the thickness of the membrane is less than or equal to 2 µm.

Thanks to the invention, an acoustic filter is formed that is suitably isolated relative to the adjacent elements, such as the transistors provided in an integrated circuit. Furthermore, one and the same membrane can support several separate acoustic filters, which proves to be particularly advantageous in terms of footprint and fabrication cost.

BRIEF DESCRIPTION OF THE DRAWINGS

The present invention will be more clearly understood on reading the detailed description of a few embodiments given by way of entirely non-limiting example and illustrated by the appended drawings, in which:

FIGS. 2 to 5 show variants of FIG. 1.

DETAILED DESCRIPTION

Figure 1:
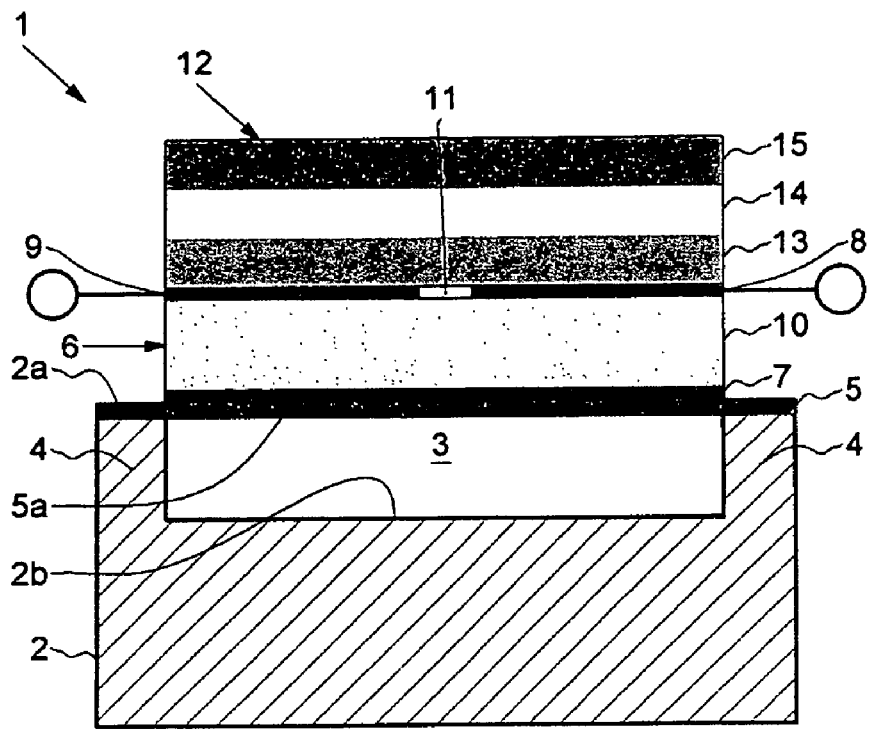
FIG. 1 is a schematic sectional view of an integrated circuit according to one embodiment of the invention.

As may be seen in FIG. 1, a component 1 comprises a substrate 2, of conventional composition, such as silicon, and having an upper surface 2a. A space 3 is formed by anisotropic etching of the substrate 2 from the upper surface 2a, which etching leaves, on either side of the concavity formed by the space 3, portions of the substrate 2 that form pillars 4.

A membrane 5, of small thickness, for example less than 2 microns, is placed above the pillars 4 and above the space 3, the membrane being made of silicon nitride $Si_3N_4$, or of silicon oxynitride SiON. Placed above the membrane is an active element 6 comprising a lower electrode 7, two upper electrodes 8 and 9 and a piezoelectric electric layer 10. The lower electrode 7 placed in contact with and on the upper surface of the membrane 5 has a small thickness and will generally be made of a metal or a metal alloy. The same applies to the upper electrodes 8 and 9. The piezoelectric layer 10 of substantially larger thickness may be made of crystalline aluminum nitride or of a ceramic, especially one containing barium, titanium, potassium, boron, zinc, etc. The piezoelectric layer 10 is placed in contact with the upper surface of the lower electrode 7. The upper electrodes 8 and 9 are placed in contact with the upper surface of the piezoelectric layer 10 and are separated from each other by an insulating portion 11, for example made of silicon oxide.

The component 1 furthermore includes a multilayer stack 12 placed on the upper surface of the upper electrodes 8 and 9 and of the insulating portion 11. The multilayer stack 12 is used to filter out certain undesirable frequencies. The multilayer stack 12 comprises three superposed layers 13, 14 and 15, the lower layer 13 being in contact with the upper electrodes 8 and 9 and with the insulating portion 11. Seen from above, the areas of the electrode 7, of the piezoelectric layer 10 and of the layers 13 to 15 are substantially identical. Of course, it would be possible to provide a multilayer stack 12 having a larger number of layers.

To ensure good filtering, a lower layer 13 of low acoustic impedance, an intermediate layer 14 of high acoustic impedance and an upper layer 15 of low acoustic impedance are provided. The layers 13 and 15 of low acoustic impedance may be based on SiOC. SiOC is a material sometimes used for producing dielectric layers with a very low permittivity on a substrate or in interconnections. Preferably, porous SiOC will be used, the acoustic impedance of which is even lower. The pores in this material are generally filled with a gas, such as argon. The intermediate layer 14 of high acoustic impedance may comprise aluminum nitride, copper, nickel, tungsten, gold, platinum or molybdenum. The aluminum nitride may be in its amorphous form, and may be advantageous as often used to produce other layers of the circuit. Copper has a lower acoustic impedance than tungsten, but has the benefit of being frequently used in circuit interconnections. A copper layer may thus be produced during a fabrication step common with other elements of the same integrated circuit. Tungsten offers a particularly high acoustic impedance.

Thus, a resonator that is inexpensive and particularly well isolated from the substrate is formed, the resonant frequency of which may be adjusted thanks to the multilayer stack 12 in which it is possible to modify relatively easily the thicknesses of the layers 13 to 15 or else the nature of the materials of which the layers 13 to 15 are made. The substrate 2 and the membrane 5 may be fabricated separately and then joined together by bonding.

It is also possible to deposit what is called a sacrificial layer, for example one made of a polymer, in the cavity, by depositing the membrane layer that is etched very locally in order to expose holes in this sacrificial layer. The sacrificial material is then removed, by etching, and the membrane released.

Figure 2:
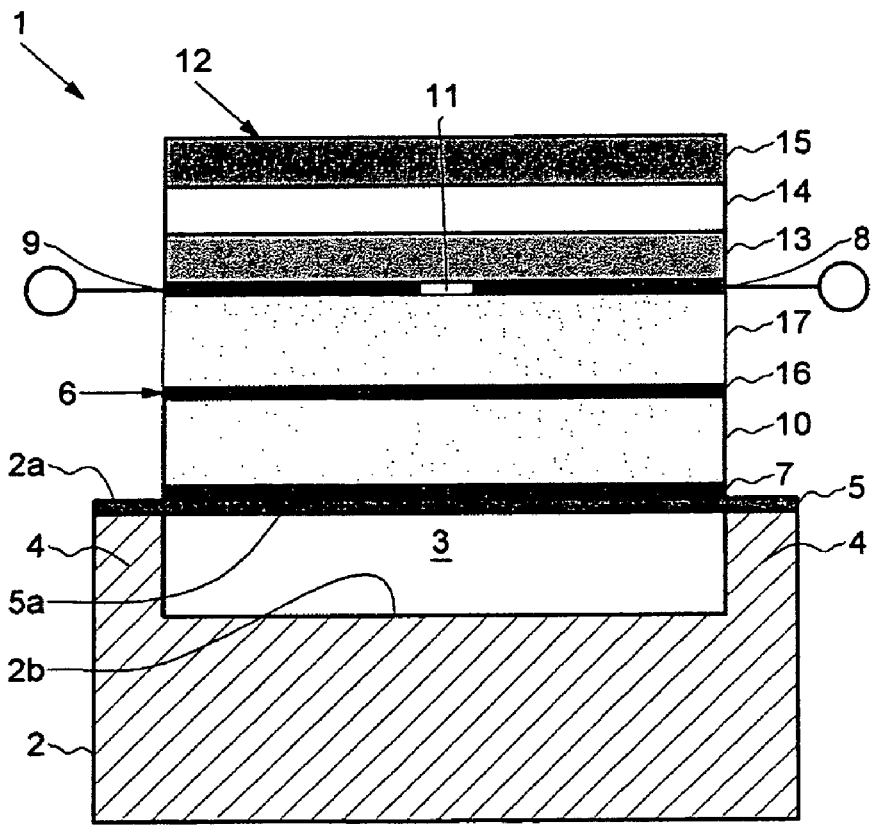

In the embodiment illustrated in FIG. 2, the reference numerals of the similar elements are preserved. This embodiment proposes a stacked-crystal filter that is mounted between a membrane and a multilayer stack. More particularly, the component 1 illustrated in FIG. 2 differs from that of FIG. 1 in that it furthermore includes an intermediate electrode 16 whose thickness and nature are similar to those of the lower electrode 7. The intermediate electrode 16 is placed on the upper surface of the piezoelectric layer 10. The active element 6 furthermore includes an additional piezoelectric layer 17 placed between the upper surface of the intermediate electrode 16 and the lower surface of the upper electrodes 8 and 9 and of the insulating portion 11. This situation thus benefits from the advantages of stacked-crystal filters, while still having the benefit of the other elements of the circuit, such as the transistors, with excellent isolation from the resonator vibrations thanks in particular to the membrane 5.

Figure 3:
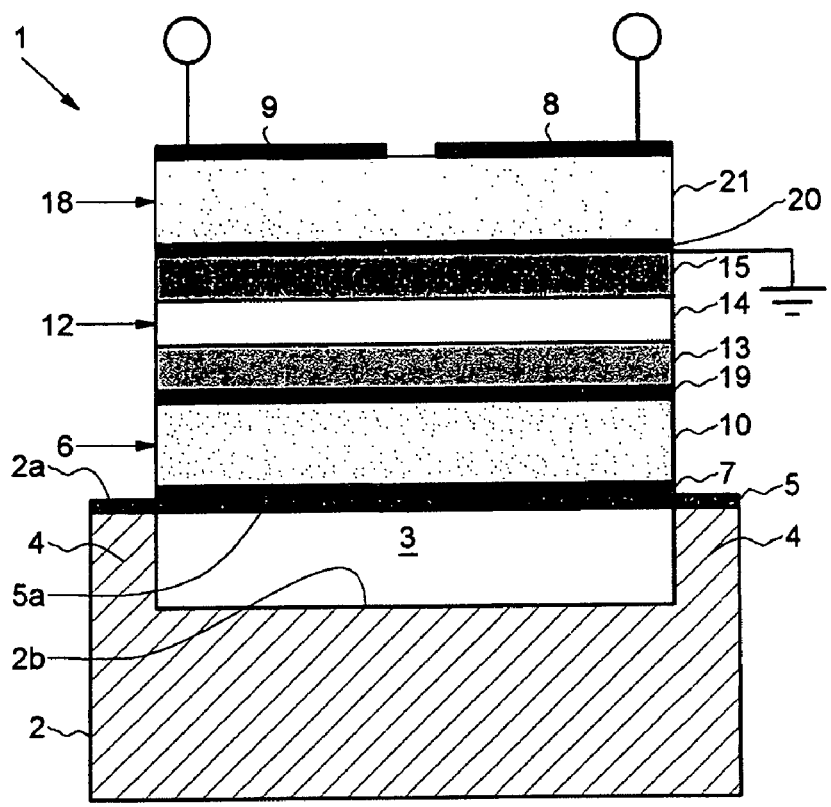

In the embodiment illustrated in FIG. 3, the component 1 comprises two active elements 6 and 18 separated by a multilayer stack 12. The active element 6 comprises a lower electrode 7 placed on the membrane 5, a piezoelectric layer 10 and an upper electrode 19. The electrodes 7 and 19 have approximately the same area as the piezoelectric layer 10 seen from above. The multilayer stack 12 provided with the layers 13, 14 and 15 is placed on the upper electrode 19. The active element 18 comprises a lower electrode 20, a piezoelectric layer 21 and two upper electrodes 8 and 9 separated from each other. The lower electrode 20 of the active element 18 may be electrically grounded and is placed on the upper surface of the upper layer 15 of the multilayer stack 12. The piezoelectric layer 21, which may be of the same composition and the same thickness as the piezoelectric layer 10, is placed on the lower electrode 20. The upper electrodes 8 and 9 are placed on the upper surface of the piezoelectric layer 21. The upper electrodes 8 and 9 cover only part of the upper surface of the piezoelectric layer 21. In contrast, the lower electrode 20 covers practically the entire lower surface of the piezoelectric layer 21.

This thus forms a coupled-resonator filter mounted on a membrane, and therefore particularly well isolated from the rest of the substrate. There is reduced mechanical coupling between the active elements 6 and 18 thanks to the multilayer stack 12, which forms a tuned stack of the Bragg mirror type. The multilayer stack 12 has a passband and isolates the upper active element 18, which is the active element for the filtered electrical signal, from the parasitic modes not rejected within the lower active element 6. Such a resonator permits differential or non-differential inputs/outputs and may dispense with a capacitor or transformer at the input of the resonator. As an example, the resonator may be connected directly to a mixer, to a power amplifier or to a low-noise amplifier. Impedance matching is possible by adjusting the layer thicknesses and by judiciously choosing the nature of the materials of the various layers. Such a resonator can therefore be produced in a fully integrated and particularly compact and adaptable manner.

Figure 4:
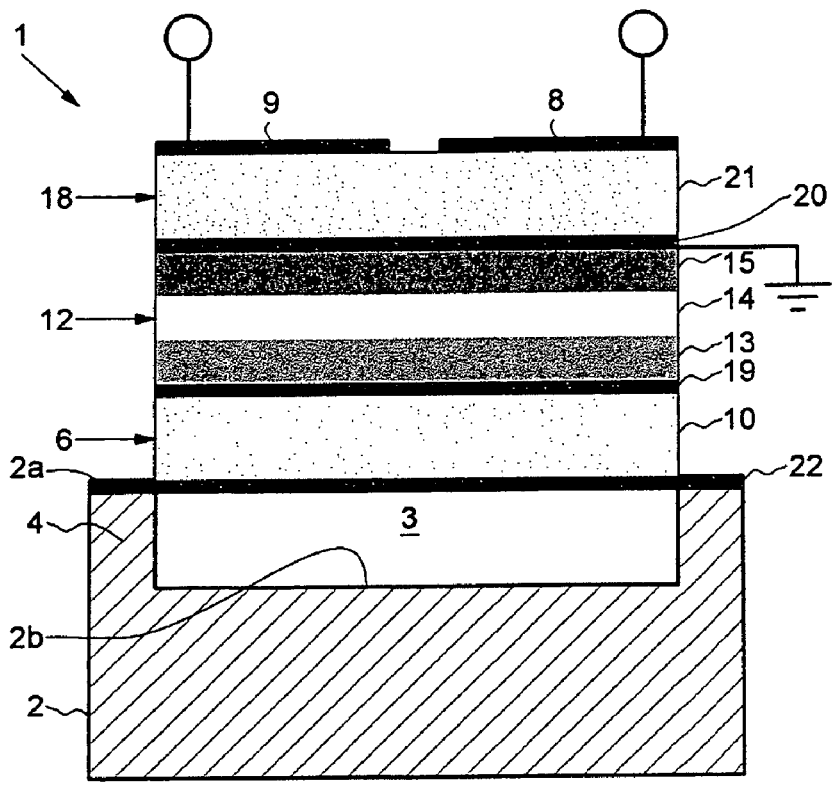

The embodiment illustrated in FIG. 4 is similar to that illustrated in FIG. 3, except that the membrane 5 and the lower electrode 7 of the active element 6 have been replaced with a membrane/electrode 22 fulfilling the electrical function of an electrode and the mechanical function of a membrane. The membrane/electrode 22 rests on the upper surface 2a of the pillars 4 of the substrate 2 and supports, by its upper surface, the piezoelectric layer 10. The membrane/electrode 22 may be made of Ag, Al, Au, Cu, La, Mo, Ni, Pt, Ta, Ti or W. This embodiment is particularly advantageous by the fact that a single layer provides both an electrical function and a mechanical isolation function.

In the embodiment illustrated in FIG. 5, two acoustic resonators 1 and 23 are provided on one and the same substrate 2, the same membrane 5 defining a space 3 for the resonator 1 and a space 24 for the resonator 23, which for the rest have similar structures. The bottom of the space 3, 24 is formed by a surface 2b of the substrate 2 some distance from the upper surface 2a so that the membrane 5 can be formed, while still maintaining a distance from the surface 2a. It is therefore possible, thanks to the excellent isolation provided by the membrane 5, for the same membrane to support a plurality of acoustic resonators. Of course, the resonator 23 may be provided with certain layers that differ in nature and/or in thickness than those of the corresponding layers of the resonator 1. In any event, it is particularly economic to take advantage of the resonators 1 and 23 having a common membrane 5. Furthermore, it is possible to design a variant in which the two cavities 3 and 24 in FIG. 5 form only a single cavity.

Furthermore, it may be advantageous to form, on the same substrate 2, microelectromechanical systems such as variable capacitors or else switches, possibly making use of the same membrane 5, or even the same cavity.

Such acoustic resonators can be used in applications such as telephony filters, terrestrial digital television, voltage-controlled oscillators, or for RF stages.

While there has been illustrated and described what is presently considered to be embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. An acoustic resonator device comprising:
   an active element having a first side and a second side, facing opposite to the first side, and having an electrical signal input electrode layer and an electrical signal output electrode layer, and wherein the active element comprises at least one piezoelectric layer;
   a support, wherein the support comprises an acoustic isolation membrane, and wherein the membrane is attached to the first side of the active element; and
   a multilayer stack, attached to the second side of the active element comprising at least three layers including at least one layer of high acoustic impedance and at least one layer of low acoustic impedance based on SiOC, and wherein the at least three layers of the multilayer stack have thicknesses and material so as to define a resonant frequency of the acoustic resonator device when the multilayer stack is attached to the active element.

2. The device according to claim 1, wherein the multilayer stack comprises two layers of low acoustic impedance surrounding a layer of high acoustic impedance.

3. The device according to claim 1, wherein the active element is in contact with a layer of low acoustic impedance of the multilayer stack.

4. The device according to claim 1, wherein the acoustic isolation membrane is formed by one of the electrical signal input electrode layer and the electrical signal output electrode layer of the active element.

5. The device according to claim 1, wherein the acoustic isolation membrane is located beneath a lower electrode of the active element, the lower electrode being one of the electrical signal input electrode layer and the electrical signal output electrode layer.

6. The device according to claim 5, wherein the acoustic isolation membrane is placed in contact with the lower electrode of the active element.

7. The device according to claim 1, wherein the active element comprises a piezoelectric layer, a lower electrode layer and an upper electrode layer, the piezoelectric layer being placed between the lower electrode layer and the upper electrode layer, and wherein the lower electrode layer being one of the electrical signal input electrode layer and the electrical signal output electrode layer and the upper electrode layer being the other one.

8. The device according to claim 1, wherein the active element comprises two piezoelectric layers and three electrode layers, one piezoelectric layer being placed between, and contacting, two electrode layers, and wherein the two electrode layers being the electrical signal input electrode layer and the electrical signal output electrode layer.

9. The device according to claim 1, wherein the active element comprises two piezoelectric layers, four electrode layers and a multilayer stack provided with at least three layers, including at least one layer of high acoustic impedance and at least one layer of low acoustic impedance, one piezoelectric layer being placed between two electrode layers, and the multilayer stack being placed between an electrode layer adjacent to a lower piezoelectric layer and an electrode layer adjacent to an upper piezoelectric layer.

10. The device according to claim 1, wherein the multilayer stack operates to tune the resonant frequency by filtering out certain undesirable frequencies generated by the active element.

11. The device according to claim 1, wherein an empty space is left beneath the acoustic isolation membrane and opposite to a side of the membrane being attached to the first side of the active element.

12. The device according to claim 1, wherein the electrode layers are based on the following materials: Al, Au, Mo, Pt, Ti, W.

13. The device according to claim 1, wherein the membrane is based on any silicon nitride or a metal nitride.

14. The device according to claim 1, wherein the at least one piezoelectric layer is based on any of the following materials: AlN, BaTiO$_3$, KNbO$_3$, ZnO.

15. The device according to claim 1, wherein the layers of high acoustic impedance of the multilayer stack are based on any of the following materials: AlN, SiO$_2$, W, Mo.

16. A plurality of acoustic resonators, each acoustic resonator comprising:
   an active element having a first side and a second side, facing opposite to the first side, and wherein the active element comprises at least one piezoelectric layer;
   a support, wherein the support comprises an acoustic isolation membrane, and wherein the membrane is attached to the first side of the active element; and
   a multilayer stack, attached to the second side of the active element, comprising at least three layers including at least one layer of high acoustic impedance and at least one layer of low acoustic impedance, and wherein the at least three layers of the multilayer stack have thicknesses and material so as to define a resonant frequency of the acoustic resonator when the multilayer stack is attached to the active element, and wherein the acoustic isolation membrane is attached to a side of each of the plurality of acoustic resonators.

17. The device according to claim 16, wherein the acoustic isolation membrane comprises an electrode layer of at least two of the plurality of acoustic resonators.

18. An integrated circuit comprising:
a circuit supporting substrate;
an electronic circuit; and
at least one acoustic resonator disposed on the circuit supporting substrate and electrically coupled with the electronic circuit, each of the at least one resonator comprising:
   an active element having a first side and a second side, facing opposite to the first side, and having an electrical signal input electrode layer and an electrical signal output electrode layer, and wherein the active element comprises at least one piezoelectric layer;
   a support, wherein the support comprises an acoustic isolation membrane, and wherein the membrane is attached to the first side of the active element; and
   a multilayer stack, attached to the second side of the active element, comprising at least three layers including at least one layer of high acoustic impedance and at least one layer of low acoustic impedance based on SiOC, and wherein the at least three layers of the multilayer stack have thicknesses and material so as to define a resonant frequency of the acoustic resonator when the multilayer stack is attached to the active element.

19. The integrated circuit of claim 18, wherein the active element comprises a piezoelectric layer, a lower electrode layer and an upper electrode layer, the piezoelectric layer being placed between the lower electrode layer and the upper electrode layer, and wherein the lower electrode layer being one of the electrical signal input electrode layer and the electrical signal output electrode layer and the upper electrode layer being the other one, and wherein the acoustic isolation membrane is formed by the lower electrode layer of the active element, and wherein an empty space is left beneath the acoustic isolation membrane and opposite to a side of the membrane being attached to the first side of the active element.

20. The integrated circuit of claim 18, wherein the acoustic isolation membrane is attached to a side of each of a plurality of acoustic resonators of the at least one acoustic resonator.

* * * * *